United States Patent [19]
Miller

[11] 3,805,195
[45] Apr. 16, 1974

[54] ADAPTIVE SURFACE WAVE DEVICES

[75] Inventor: Arthur Miller, Princeton Junction, N.J.

[73] Assignee: RCA Corporation, New York, N.Y.

[22] Filed: Dec. 22, 1972

[21] Appl. No.: 317,718

[52] U.S. Cl. .................. 333/30 R, 310/9.8, 333/72, 340/173.2
[51] Int. Cl. ..... H03h 7/30, H03h 9/30, H03k 13/02
[58] Field of Search .......... 333/30, 72; 310/9.7, 9.8; 340/173.2, 167 B, 173 MS

[56] References Cited

UNITED STATES PATENTS

| | | | |
|---|---|---|---|
| 3,037,196 | 5/1962 | Brennenmann | 333/30 R X |
| 3,335,299 | 8/1967 | Yando | 310/9.8 |
| 3,699,482 | 10/1972 | Ash et al. | 333/72 X |
| 3,713,036 | 1/1973 | Thomann | 333/30 R |
| 3,701,147 | 10/1972 | Whitehouse | 333/30 X |

OTHER PUBLICATIONS

Klerk–"Ultrasonic Transducers 3. Surface Wave Transducers", in Ultrasonics, Jan. 1971; pp. 35–48.

*Primary Examiner*—James W. Lawrence
*Assistant Examiner*—Marvin Nussbaum
*Attorney, Agent, or Firm*—Edward J. Norton

[57] ABSTRACT

A surface wave acoustic device which comprises a plurality of input and/or output electrodes in contact with the surface of a ferroelectric material which exhibits piezoelectric properties. The sign of the piezoelectric coefficient of the ferroelectric material between selected electrode pairs, and therefore the relative phasing of each electrode pair, is determined by controlling the ferroelectric polarization in the region of each electrode pair. Control of the ferroelectric polarization is accomplished by switching the ferroelectric material between two states of remanent polarization.

8 Claims, 9 Drawing Figures

ADAPTIVE SURFACE WAVE DEVICES

BACKGROUND OF THE INVENTION

This invention relates to acoustic surface wave signal processing devices, and more particularly, to a device termed a multitapped delay line in which an input signal is converted into an acoustic surface wave that travels along the surface of a medium to one or more spaced output transducers.

Acoustoelectric devices, in which acoustic surface waves propagating in a piezoelectric material or substrate interact with at least one transducer coupled to the material surface, are known. In practice, such devices have been demonstrated to exhibit characteristics useable in a number of different applications. In a television or radar receiver, for example, acoustic filter systems may be included in the IF channel in order to impose a desired IF characteristic at selected frequencies spaced from the IF carrier frequency as determined by the structure of the acoustic filters included in the system. As another example, matched filters have been built using tapped delay lines consisting of an input-output interdigital-transducer pair and intermediate-placed single finger-pair taps separated by a distance corresponding to a particular surface wave delay.

The usefulness of acoustic surface wave tapped delay lines as sequence generators and matched filters has been recognized. Code flexibility, that is, the ability to conveniently vary the phase characteristics at the tap positions, has been achieved by integrating the sequence generator matched-filter combination with a suitable array of semiconductor switching elements. The desired bi-phase code of a surface wave tapped delay line can be controlled by employing diode transmission gates between each interdigital finger and the sum lines of the surface wave device. In this manner the phase of any tap can be changed by 180° by varying the bias on each set of diode transmission gates. Another known technique of encoding an acoustic matched filter is by first depositing the interdigital transducer pair configuration on the piezoelectric substrate and "burning" away the undesired electrode portions to provide a filter with the desired phased characteristics at the various taps. However, since many applications require matched filters which can be rapidly set to different codes, the permanency of the burning technique has obvious disadvantages. The disadvantages of diode transmission gates and their associated external circuitry in terms of expense and complexity are also clear.

The present invention overcomes these disadvantages by providing an acoustic surface wave device wherein the above-mentioned encoding is performed entirely within the substrate material by appropriately altering the characteristics of the material itself.

SUMMARY OF THE INVENTION

In accordance with the present invention an acoustic surface wave device comprises a substrate of which at least a portion of a surface region is ferroelectric and piezoelectric. The ferroelectric polarization of the portion of the region is switchable between two states of remanent polarization and the piezoelectric coefficient of that portion of the region changes sign in correspondence with the remanent polarization of that portion of the region. Means including at least one pair of spaced electrodes on the surface are provided for developing electrical signals between the electrodes.

BRIEF DESCRIPTION OF THE DRAWING

The advantages of this invention will become more readily appreciated as the same becomes better understood by reference to the following detailed description when taken in conjunction with the accompanying drawing wherein.

DETAILED DESCRIPTION

Figure 1:
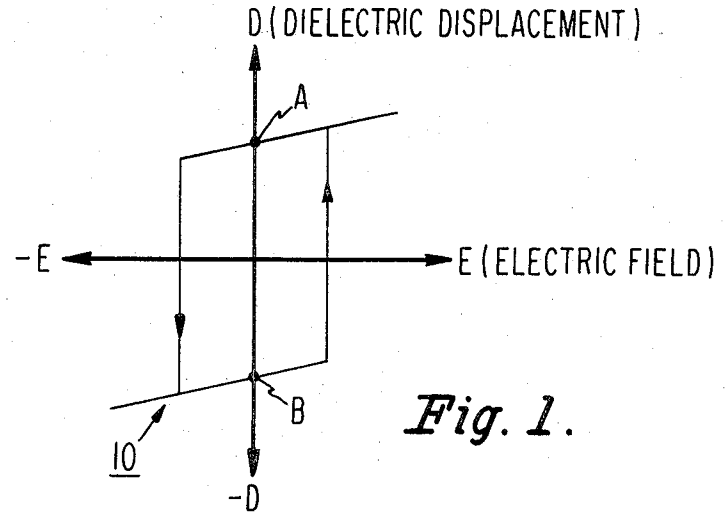
FIG. 1 is a graph of the hysteresis curve of a ferroelectric material of the type which may be used in practicing the present invention.

FIG. 1 represents a typical hysteresis curve, shown generally at 10, for a ferroelectric material. The electric field E which is applied to the ferroelectric material is plotted along the abscissa. The dielectric displacement D (or polarization) is plotted along the ordinate. A first state of remanent polarization, i.e. polarization remaining in the absence of an applied electric field, is represented by point A on curve 10. The second remanent state of polarization is represented by point B on curve 10. The remanent state of polarization of a ferroelectric material may be switched to either state by applying to the material an electric field, of the proper polarity and of a magnitude which exceeds the "coercive field" of the material.

Essentially all ferroelectric materials also exhibit piezoelectric properties. By applying an electrical signal to a pair of electrodes or transducer attached to the surface of a suitable prior art piezoelectric material the interaction between the electrical signal and the material results in the generation of an acoustic wave. The instantaneous phase of this generated acoustic wave is determined by the sign of the piezoelectric coefficient. The phase of the acoustic wave can be reversed by reversing he polarity of the applied electrical signal or by reversing the relative positions of the electrodes. The phase of the acoustic wave could also be reversed, however, by suitably changing the sign of the piezoelectric coefficient of the material. Interestingly, the sign of the piezoelectric coefficient of a ferroelectric material may be reversed by reversing the remanent state of polarization of the ferroelectric material. In the present invention, as discussed more fully hereinafter, advantage is taken of the intercooperation between the remanent states of polarization of a ferroelectric material and the sign of the piezoelectric coefficient of the material corresponding to each state of remanent polarization.

Figure 2:
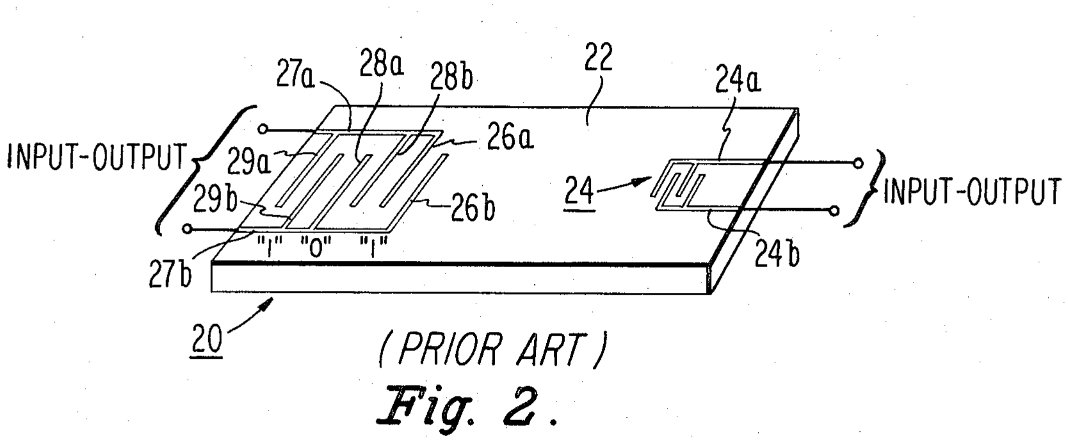
FIG. 2 is an example of a tapped delay line in accordance with the prior art.

Before discussing the various embodiments of the present invention reference is made to FIG. 2 which shows an example of a prior art acoustic wave device 20 arranged as a tapped delay line.

Device 20 comprises a piezoelectric substrate 22 on which is deposited, bonded or otherwise attached to the piezoelectric substrate 22, an input-output, interdigital transducer 24. Interdigital transducer 24 incorporates digital portions 24_a_ and 24_b_ which are extended to provide external terminals. Separated by a distance corresponding to a particular surface wave delay are interdigital finger electrodes 26*a* and 26*b* which together form a tap position and which are in turn coupled to sum lines 27*a* and 27*b* respectively. Two additional electrode pair taps comprising finger electrodes 28*a*–28*b* and finger electrodes 29*a*–29*b* are also shown coupled to sum lines 27*a* and 27*b*. Sum lines 27*a* and 27*b* are also extended from substrate 22 to provide input-output terminals for coupling to device 20. The spacing between the individual electrode pair taps usually corresponds to a given integer of acoustic half wave length for reasons which will become clear in light of the following discussion.

Device 20 may be used as a matched filter or as a means to generate a particular code. In the operation of device 20 as a matched filter an electrical input signal is applied to the external terminals of transducer 24. The interaction between the electrical input signal and the portion of the substrate 22 in the region of transducer 24 launches an acoustic surface wave toward the opposite end of device 20. When the acoustic wave arrives at electrode pair 26*a*–26*b* the interaction between the substrate surface and the electrode pair will cause a voltage to be developed across the pair which is in turn coupled across sum lines 27*a* and 27*b*. The resulting electrical output signal appearing on sum lines 27*a* and 27*b* will have a phase which may be arbitrarily designated as a binary "1" as shown in FIG. 2. When the same acoustic wave arrives in the region of electrode pair 28*a*–28*b* a similar electrical output signal will be developed across sum lines 27*a* and 27*b;* however, since the relative finger electrode positions of the first and second electrode pairs are reversed, the relative phase of the electrical output signal at this point will be reversed to that of the first electrode pair. Accordingly, the phase of the signal at this point is designated as a binary "0". When the acoustic surface wave arrives at the remaining electrode pair 29*a*–29*b* an electrical output signal will also be developed across electrode pair 29*a*–29*b* and therefore sum lines 27*a* and 27 *b*. The phase of the electrical signal developed across electrode pair 29*a*–29*b* will be identical to that of the signal developed across the first pair as electrodes 29*a* and 29*b* are arranged in a manner which is similar to electrodes 26*a* and 26*b*. Accordingly, the phase of the signal at this point is also designated as a binary "1".

It should now be appreciated that if device 20 is deployed as a matched filter for detecting, for example, a biphase-coded continuous waveform (that is, a waveform that changes its phase by 180° at predetermined time intervals) having a coding which agrees with the binary 101 code addressed in the device 20 of FIG. 2, the resulting output signal at the RF sum lines will be maximum when the varying acoustic wave is spatially in registry with the three corresponding electrode pairs. Further, device 20 may also be used to detect a linearly varying FM input signal by varying the distance or periodicity between the electrode pairs so as to conform temporally with the frequency deviation vs. time characteristic of the FM input signal. Similarly, device 20 can be used to produce codes. For example, if an electrical input signal such as an impulse or "delta" function is applied to sum lines 27*a* and 27*b*, a surface wave will be simultaneously launched from each electrode pair. After traveling across the surface of device 20 the individual surface waves, which propagate at equal velocities but traverse varying distances and are therefore separated in time, will develop a bi-phase coded output voltage across the output terminals of transducer 24 which conforms in time to the preselected code or binary 101.

It should now be appreciated that in order to achieve coding flexibility, that is, the ability to conveniently vary the phase characteristics at the tap positions, additional switching circuitry interposed between the individual electrodes and the sum lines is required. Further, even in those instances where only a fixed or permanent code is required, it is nevertheless sometimes desirable to be able to vary a limited number of tap positions in order to achieve fine tuning, etc. However, in many prior art devices, once the electrode pair array is permanently affixed to the substrate material, minor adjustments of this type cannot be achieved.

Figure 3:
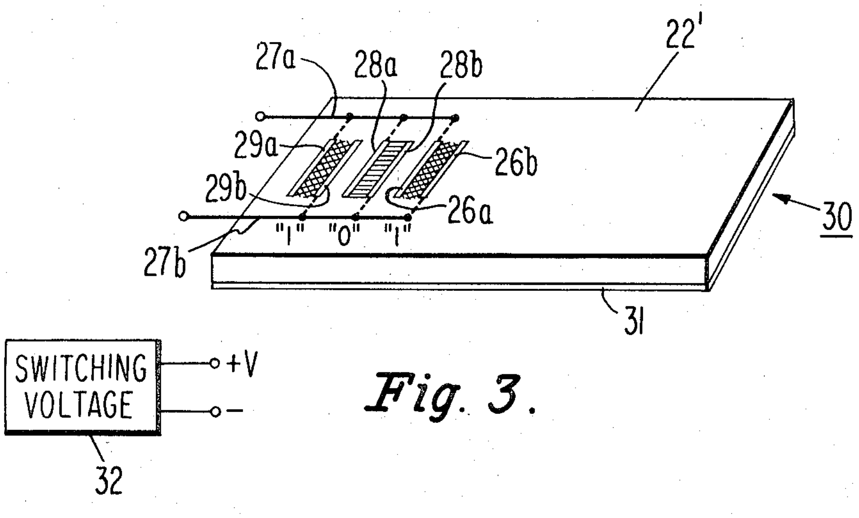
FIGS. 3—8 show, respectively, different embodiments of the present invention.

Referring now to FIG. 3, wherein like elements bear like reference numerals, there is shown generally at 30 an acoustic surface wave device in accordance with the principles of the present invention. Substrate 22' of FIG. 3 differs from substrate 22 of FIG. 2 in that substrate 22' exhibits ferroelectric properties. In this embodiment three electrode pairs are also shown in conjunction with, but unconnected to, sum lines 27*a* and 27*b*. The unconnected portions of the individual electrodes are shown as dotted lines. For clarity, input-output transducer 24 is not shown. Device 30 may also incorporate a ground plane 31 which may be coupled or bonded to the undersurface of substrate 22'. A switching voltage source 32, which provides a direct-current voltage V, is also shown in FIG. 3. The voltage V provided by source 32 may be used to establish the desired code or phasing of each electrode pair. For example, by applying the output terminals of source 32 to unconnected electrodes 26*a* and 26*b* respectively, the remanent state of polarization of the ferroelectric material in the region between electrodes 26*a* and 26*b* can be determined. The state of polarization will correspond to the polarity of the applied electric field provided that the magnitude of the applied electric or E-field as determined by the magnitude of the applied voltage and the interelectrode spacing, exceeds the coercive field of the ferroelectric material in the region between the individual electrodes.

Stated differently, the remanent state of polarization of the ferroelectric material is switched between its remanent states of polarization in accordance with the polarity of the applied electric field when the applied field exceeds the characteristic coercive field of the ferroelectric material. It will now be appreciated that, in accordance with the present invention, the sign of the piezoelectric coefficient of the ferroelectric material in the region between electrodes 26*a* and 26*b*, and therefore the code or phase of tap position 26*a*–26*b*, will correspond to the controlled state of remanent polarization of the ferroelectric material. The controlled surface region of ferroelectric material between electrodes 26*a* and 26*b* is represented by crosshatched lines in FIG. 3; and the corresponding sign of the piezoelectric coefficient is designated as a binary "1".

Similarly, the remanent state of polarization of the material in the region between electrodes 28*a* and 28*b* in FIG. 3 may also be determined. Further, the resulting remanent state, and therefore the sign of the piezoelectric coefficient, may be reversed relative to that of electrodes 26*a* and 26*b* provided that the polarity of the applied voltage is reversed with respect to the voltage used to establish the remanent state between the first electrode pair. Accordingly, the controlled surface between electrodes 28*a* and 28*b* is represented by parallel lines; and the corresponding sign of the piezoelectric coefficient is designated as a binary "0". Finally, the remanent state of polarization of the third electrode pair 29*a* and 29*b*, may also be determined in a manner similar to that of the first pair thereby rendering an overall binary code of 101.

After addressing each electrode pair in this manner the various electrode fingers may be coupled or bonded to the respective sum lines 27*a* and 27*b* in the usual manner. It should be also noted that although the physical configuration of each electrode pair is identical in appearance, the desired code is nevertheless established by controlling the characteristics of the ferroelectric material between each pair.

Alternatively, the desired address or code of device 30 of FIG. 3 can be determined by applying a suitable electric field between ground plane 31 and the surface electrodes which define the desired region of ferroelectric material to be controlled. For example, by commonly coupling one terminal of source 32 to electrodes 26*a* and 26*b*, and coupling the other electrode of source 32 to ground plane 31, the region of ferroelectric material between these electrodes can be switched to the desired state of remanent polarization. It should be noted that ground plane 31 is only required when the ferroelectric switching is accomplished in this alternative manner.

In the operation of the devices constructed in accordance with the principles of the present invention, the electrical signals applied to the input-output terminals of the device, should be limited so that the resulting E-fields are less than the value of the characteristic coercive field of the ferroelectric material. In this manner, inadvertent switching of the remanent state of the material can be avoided. However, the magnitude of the electric fields which are employed to accomplish switching of the ferroelectric material should be substantially greater than the value of the characteristic coercive field. In this manner, rapid and efficient switching can be accomplished.

Although virtually all ferroelectric materials are inherently capable of being switched between remanent states of polarization, it is known that some materials are more amenable to such switching than others. Among the group of more suitable candidates are: lead zirconate titanate (PZT), barium titanate, gadolinum molybdate, and bismuth titanate. However, in practicing the present invention, the particular application and device configuration, as well as the availability of external switching voltages, will largely dictate the choice of a particular ferroelectric material for the acoustic surface device.

Figure 4:
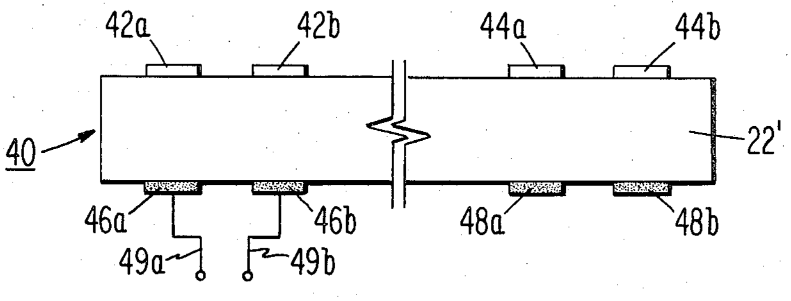

FIG. 4 shows a second embodiment of the present invention wherein the switching fields are applied to the desired portions of the ferroelectric-piezoelectric material via electrodes other than the operating or signal electrode pairs. FIG. 4 shows an end view of a device 40 which comprises a relatively thin ferroelectric substrate 22'. Two pairs of signal electrodes 42*a*–42*b* and 42*a*–44*b* are shown in FIG. 4. These electrodes may be deposited, bonded or otherwise attached on the surface of substrate 22 in the usual manner. Device 40 includes separate switching electrodes 46*a*–46*b* and 48*a*–48*b* which may also be deposited, bonded or otherwise attached to the undersurface of substrate 22. External switching terminals are provided by way of leads 49*a* and 49*b*. It can be seen that the physical location of each switching electrode is in substantial registry with its corresponding signal electrode. In this embodiment the state of remanent polarization at the desired region can be achieved by applying a voltage to the corresponding switching electrode pairs as for example by coupling the terminals of switching voltage source 32 of FIG. 3 to leads 49*a* and 49*b* of FIG. 4. This embodiment has the advantage that the interdigital signal electrodes can be coupled to the surface of the substrate 22 in their permanent configuration thereby permitting the addressing or switching operation to be conducted entirely independent of the various connections on the surface of substrate 22.

Figure 5:
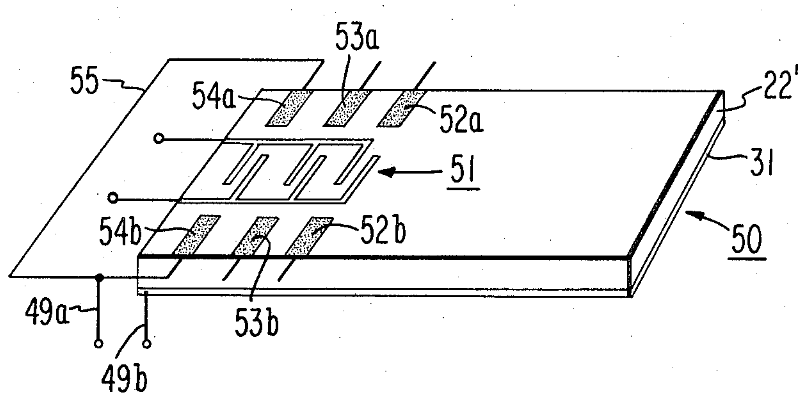

The embodiment of the present invention shown in FIG. 5 also has the advantage of the embodiment of FIG. 4 in that the ferroelectric material may also be switched independent of the signal electrode pair array. Device 50 of FIG. 5 comprises a ferroelectric substrate 22' coupled to a ground plane 31. The signal electrode pair array is shown generally at 51. Three pairs of switching electrodes 42*a*–42*b*, 53*a*–53*b*, and 54*a*–54*b* are shown in substantial registry with each of the three corresponding signal electrode pairs of array 51. In this embodiment the switching is accomplished by commonly coupling the individual switching electrode pairs together and applying the switching field between the electrodes and a ground plane. For example, in FIG. 5 a lead 55 commonly couples electrodes 54*a* and 54*b*, and a switching voltage is applied between lead 55 and ground plane 31 via switching leads 49*a* and 49*b*. The embodiment shown in FIG. 5 is particularly suited for use with ferroelectric materials with specially shaped domains such as the isostructural ferroelectric rare-earth molybdates, for example gadolinium molybdate [$Gd_2(MoO_4)_3$]. Materials of this type have the property that the domain walls, which define the region of different ferroelectric polarization, run preferentially across the entire width of the material, that is, in a direction which is substantially perpendicular to the propagation direction of the acoustic wave in device 50 of FIG. 5. In the embodiment of FIG. 5, the component of polarization which is switched within the ferroelectric material, is perpendicular to the plane of device 50.

Figure 6:
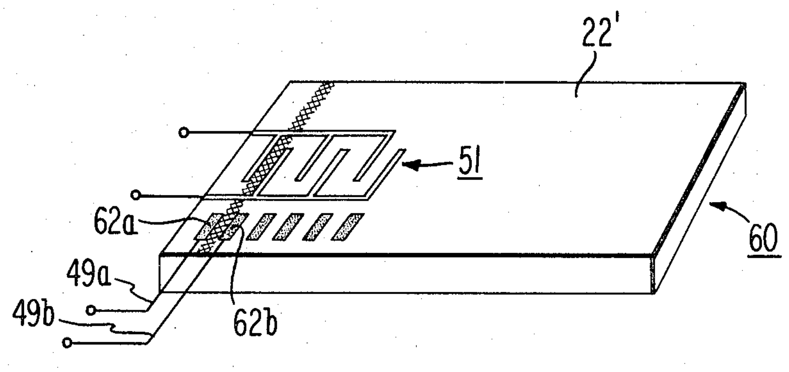

FIG. 6 shows an alternate embodiment of the present invention which also has the advantage that the switching operation is accomplished externally of the signal electrode array. The embodiment of FIG. 6 is also particularly suited for use with ferroelectric materials having specially shaped domains as in the embodiment of FIG. 5 but differs in that the component of polarization of the ferroelectric material being switched, lies substantially in the plane of the device. The switching electrodes of the device 60 of FIG. 6, such as switching electrodes 62*a* and 62*b*, are placed in pairs on either side of signal electrode array 51 in such a manner that the distance between the individual electrodes of each switching electrode pair is substantially equal to the distance between the individual electrodes of the signal electrode pair associated therewith. By applying an electric field across the ferroelectric material between the switching electrodes the remanent state of polarization of the ferroelectric material will be determined in accordance with the polarity of the applied voltage.

The total region of the ferroelectric material thusly affected will normally extend substantially across the entire width of the substrate; that is, a strip extending not only through the length of the switching electrodes but to and through the corresponding interdigital electrode pair. This switched region is represented by cross-hatched lines in FIG. 6.

Figure 7:
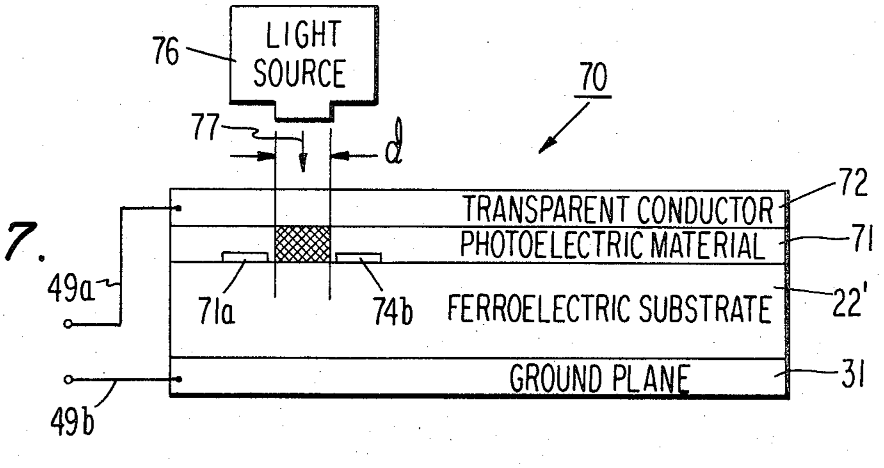

FIG. 7 shows a ferroelectric-photoconductor device in accordance with the present invention. Device 70 comprises a ferroelectric substrate 22' upon which a photoelectric material layer 71 is deposited, bonded or otherwise attached. A transparent conductor 72 is similarly disposed on the surface of the photoelectric material 71. A ground plane 31 is coupled, bonded or otherwise attached to the underside of substrate 22'. For clarity, only a single pair of electrodes *74a–74b* are shown located on the surface of the ferroelectric substrate 22'. A light source 76 which includes suitable imaging optics, provides a uniform beam of light 77 having a given width dimension *d*. A pair of switching voltage terminals are provided to device 70 by way of leads 49*a* and 49*b* which are in turn coupled to conductor 72 and ground plane 31 respectively.

The operation of the device 70 in accordance with the present invention will now be described. Light beam 77, imaged upon photoelectric material 71 through transparent conductor 72, illuminates a volume portion of photoconductor 71 between electrode pair 74*a*–74*b* as defined by dimension *d*. Accordingly, this portion of photoconductor 71 will exhibit enhanced conductivity. Thereafter the application of a voltage between leads 49*a* and 49*b* will result in the establishment of an electric field between transparent conductor 72 and ground plane 31 in the region defined by dimension *d* and represented by the cross-hatched region in FIG. 7. Accordingly, the state of remanent polarization of ferroelectric material 22' in this region will be determined by the polarity of the voltage applied to leads 49*a* and 49*b*. Thus, in accordance with the present invention the sign of the piezoelectric coefficient of the substrate material in the region is also determined by the polarity of the applied voltage. The dimension *d* is preferably selected to be slightly less than the physical separation between the individual electrodes of electrode pair 74*a*–74*b*. In this manner, the conductive path provided by the photoelectric material will be limited to the region within a particular electrode pair. That is, since a plurality of signal electrode pairs may be commonly connected to one of two sum lines in a given configuration, a distance *d* greater than the individual electrode spacing might otherwise establish an electrical path between transparent electrode 72 and an undesired plurality of signal electrode pairs, accordingly selective addressing could be frustrated. The mechanics of implementing this photoelectric technique are also described generally in: Keneman et al., "Storage of Holograms in a Ferroelectric-Photoconductive Device", Applied *Physics Letters*, Vol. 17 (1970).

Figure 8:
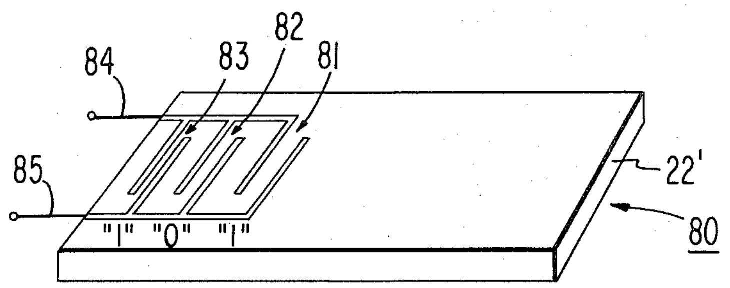

FIG. 8 shows an alternative embodiment of the present invention where the distances between the individual electrodes of each signal electrode pair may be varied to provide a wide-band acoustic surface wave device. That is, since the spacing between the individual interdigital electrodes of each electrode pair varies device 80 of FIG. 8 will respond to a plurality of fixed frequencies rather than a single frequency as is the case where the distance between the individual electrodes of each electrode pair is equal. As discussed below, the varying spacing of each electrode pair in the embodiment of FIG. 8 provides a convenient means to accomplish the desired coding.

Device 80 of FIG. 8 comprises a ferroelectric substrate 22' and three pairs of interdigital electrodes designated as 81, 82 and 83. An individual electrode of each electrode pair is coupled to sum line 84 and the other electrode of each electrode pair is coupled to sum line 85. It should be apparent that if an electrical voltage is applied across sum lines 84 and 85, electric fields of differing strength will be imposed across the individual electrode pairs. That is, since the electrode spacing, for example, of electrode pair 83 is substantially less than the spacing of electrode pair 81, the resulting field between the individual electrodes of electrode pair 83 will be substantially greater than the field across the electrodes of electrode pair 81 for any fixed level of applied voltage.

The electrode pairs of various widths may be positioned along the transducer array in any sequence; however, the ratio of the spacings between any two electrode pairs should preferably deviate sufficiently from unity. Accordingly, a voltage pulse which is of sufficient amplitude and duration to switch the ferroelectric material within the region defined by a narrower electrode pair, substantially to completion, will not cause appreciable switching of the ferroelectric within a wider electrode pair.

In the operation of device 80 of FIG. 8, any desired code can be established in device 80 by applying across sum lines 84 and 85 a proper time-sequential array of switching pulses. Advantageously, the same sum lines 84 and 85 may subsequently be used for signal processing. One prescription for the sequence of switching pulses that may be employed to establish any desired code is as follows.

A switching voltage pulse of sufficient amplitude and duration is applied with the polarity required for the widest electrode pair in the array. All narrower electrode pairs will also be switched to this polarity in this process. If the polarity required for the next widest electrode pair, in descending order, is opposite to that which has been established for the widest gap, then a switching voltage pulse of opposite polarity to the first is applied of sufficient amplitude and duration to switch the ferroelectric in the second widest electrode pair, substantially to completion, but which does not, however, cause appreciable switching of the ferroelectric in the widest electrode pair. On the other hand, it will be apparent that if the polarity required for the second widest electrode pair is the same as that established for the widest electrode pair, a separate switching pulse is therefore not required for the second widest electrode pair. For the remaining electrode pairs, an opposite polarity pulse is applied with an amplitude and duration just sufficient to switch the widest remaining electrode pair whose required polarity is opposite that of the original or widest electrode pair. Thereafter, the amplitude and duration of the next voltage pulse, which has the same polarity as that of the original switching pulse, is determined by the width of the next widest gap that must be switched. This sequence is continued until the polarity of the narrowest electrode pair has been established.

Figure 9:
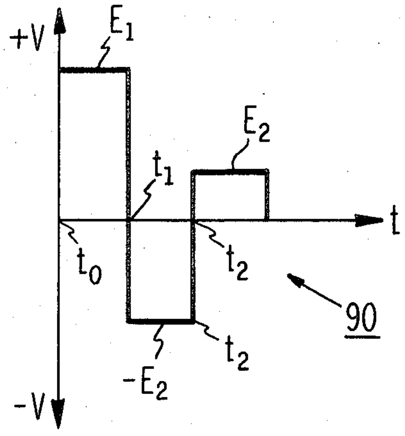
FIG. 9 is a graphical representation of a switching signal input which may be used in conjunction with the embodiment disclosed in FIG. 8.

The operation of device 80 of FIG. 8 may also be described in conjunction with the graph 90 of FIG. 9 which is a plot of applied voltage versus time $t$. At time $t_0$ a voltage is applied across sum lines 84 and 85 which results in a field $E_1$ being established across the individual electrodes of electrodes of each electrode pair. The magnitude of the voltage applied across the sum lines and therefore the strength of the electric field $E_1$ is preselected so as to switch the remanent polarization state of the ferroelectric material in the regions between the individual electrode of each pair and thereby establish an arbitrary 111 binary code in device 80. At time $t_1$ the applied voltage is reduced to a level and reversed in phase to establish an electric field of strength $-E_2$ across each electrode pair. The strength of field $-E_2$ is preselected so as to switch only the ferroelectric material in the regions between the individual electrodes of electrode pairs 82 and 83. Accordingly, at this time, the code addressed into device 80, reading from left to right in FIG. 8 represents a binary 001. At time $t_2$ the applied voltage is further reduced to a level and again reversed in phase to establish an electric field of strength $E_3$ across each electrode pair. The strength of field $E_3$ is preselected so as to switch only the ferroelectric material in the region between the individual electrodes of electrode pair 83. Thus the resulting binary code addressed in device 80 is 101 as indicated in FIG. 8.

Thus it should be appreciated that by selecting an appropriate switching signal which varies with respect to time, virtually any desired code can be established in device 80. Further, device 80 may include any given number of electrode pairs spaced in any desired configuration.

It should be appreciated that the present invention is not limited to the particular acoustic wave devices described in the various figures. For example, the individual electrode pairs may take the form of any one of an infinite number of geometrical patterns. Additionally, a single surface wave device, in accordance with the present invention, may incorporate separate input and output electrode arrays wherein the ferroelectric material between the individual electrodes of each array is appropriately coded or otherwise altered. Further, the device may be used as a matched filter, bi-phase correlator, acoustic surface wave sequence generator or as any other surface wave device wherein it is desired to alter the phase or sign of the piezoelectric coefficient between respective electrodes in order to establish a particular address or predetermined code.

What has been taught then is a surface wave acoustic device having adaptive addressing characteristics which permits coding or addressing to be accomplished within the ferroelectric-piezoelectric material itself, thereby avoiding external switching and/or memory circuits or other less flexible means for encoding the acoustic device.

What is claimed is:

1. An adaptively coded acoustic surface wave device, comprising:

a substrate of which at least a portion of a surface region is ferroelectric and piezoelectric, wherein the ferroelectric polarization of said portion of said region is switchable between two states of remanent polarization and wherein the piezoelectric coefficient of said portion of said region changes sign in correspondence with the remanent polarization of said portion of said region;

first means including a plurality of spaced electrode pairs on said surface for developing an electrical signal between said electrodes; and second means coupled to said substrate for switching the ferroelectric polarization of the portion of said surface region between the electrodes of selected ones of said plurality of electrode pairs, wherein the respective remanent states of polarization of said plurality of electrode pairs vary in accordance with a predetermined code.

2. The acoustic surface wave device according to claim 1 with each pair having a different distance between its individual electrodes wherein the respective distances between said individual electrodes of at least two pairs is significantly unequal, and each pair having one electrode coupled to a first sum line and the other electrode of each pair being coupled to a second sum line.

3. The acoustic surface wave device according to claim 1, wherein said second means incorporates said first means.

4. An acoustic surface wave device, comprising:

a substrate of which at least a portion of a surface region is ferroelectric and piezoelectric, wherein the ferroelectric polarization of said portion of said region is switchable between two states of remanent polarization and wherein the piezoelectric coefficient of said portion of said region changes sign in correspondence with the remanent polarization of said portion of said region;

means including at least one pair of spaced electrodes on said surface for developing an electrical signal between said electrodes; and second means coupled to said substrate for switching the ferroelectric polarization of a selected portion of the surface region between said electrodes in response to an electric field, said second means including optical means and further including a transparent conductor disposed on a given surface of said substrate, a photoconductive layer interposed between said substrate and said transparent conductor, a ground plane disposed on an opposite surface of said substrate relative to said given surface.

5. An acoustic surface wave device, comprising:

a substrate of which at least a portion of a surface region is ferroelectric and piezoelectric, wherein the ferroelectric polarization of said portion of said region is switchable between two states of remanent polarization and wherein the piezoelectric coefficient of said portion of said region changes sign in correspondence with the remanent polarization of said portion of said region;

means including at least one pair of spaced electrodes on said surface for developing an electrical signal between said electrodes; and second means coupled to said substrate for switching the ferroelectric polarization of a selected portion of the surface region between said electrodes in response to an electric field, wherein said second means comprises at least one pair of switching electrodes coupled to said surface of said substrate, said switching electrodes being in substantial registry with said spaced electrodes and spaced a given distance from said spaced electrodes wherein the distance between the individual electrodes of said switching electrodes is substantially equal to the distance between the individual electrodes of said spaced electrodes.

6. The acoustic surface wave device according to claim 5, wherein said substrate is an isostructural rare-earth molybdate.

7. The acoustic surface wave device according to claim 1, wherein said substrate comprises a ferroelectric and piezoelectric material selected from the group consisting of lead zirconate titanate, barium titanate and bismuth titanate.

8. An adaptively coded acoustic surface wave device, comprising:

a substrate of which at least a surface region is ferroelectric and piezoelectric, wherein the ferroelectric polarization of said region is switchable between two states of remanent polarization and wherein the piezoelectric coefficient of said region changes sign in correspondence with the remanent polarization of said portion of said region;

a plurality of electrode pair taps coupled to said surface region, each of said electrode pair taps comprising first and second individual electrodes;

means for coupling one of said electrodes of each electrode pair of a first sum line, and for coupling the remaining electrode of each electrode pair to a second sum line;

an input-output transducer means coupled to said substrate; and means for individually and selectively switching the remanent state of polarization of a substantial proportion of the portion of said surface region between said electrodes of each of said electrode pair taps.

* * * * *

UNITED STATES PATENT OFFICE

CERTIFICATE OF CORRECTION

Patent No. 3,805,195 Dated April 16, 1974

Inventor(s) Arthur Miller

It is certified that error appears in the above-identified patent and that said Letters Patent are hereby corrected as shown below:

Column 5, line 64 - "42a" should be --44a--.
Column 12, line 3, Claim 8 - After "said" delete --portion of said--.
Column 12, line 8, Claim 8 - Change "of" to --to--.

Signed and sealed this 22nd day of October 1974.

(SEAL)
Attest:

McCOY M. GIBSON JR.
Attesting Officer

C. MARSHALL DANN
Commissioner of Patents